United States Patent
Sindhushayana et al.

(10) Patent No.: US 6,304,985 B1
(45) Date of Patent: Oct. 16, 2001

(54) CODING SYSTEM HAVING STATE MACHINE BASED INTERLEAVER

(75) Inventors: Nagabhushana T. Sindhushayana, San Diego, CA (US); Jeremy Stein, Tel-Aviv (IL); Rajiv Vijayan, San Diego, CA (US)

(73) Assignee: Qualcomm Incorporated, San Diego, CA (US)

( * ) Notice: Subject to any disclaimer, the term of this patent is extended or adjusted under 35 U.S.C. 154(b) by 0 days.

(21) Appl. No.: 09/158,457

(22) Filed: Sep. 22, 1998

(51) Int. Cl.[7] ................................................. G06F 11/00
(52) U.S. Cl. ................................. 714/702; 714/755
(58) Field of Search .................................. 714/702, 755, 714/756

(56) References Cited

U.S. PATENT DOCUMENTS

| | | | |
|---|---|---|---|
| 3,597,752 | * 8/1971 | Eldert et al. | 360/40 |
| 5,151,901 | * 9/1992 | Shenoi et al. | 370/521 |
| 5,721,949 | * 2/1998 | Smith et al. | 710/5 |
| 5,835,968 | * 11/1998 | Mahalingaiah et al. | 711/214 |
| 5,960,467 | * 9/1999 | Mahalingaiah et al. | 711/214 |

OTHER PUBLICATIONS

TR45.5.4 Standards Document Entitled "Turbo Code and Its Performance", by Lee et al., Hughes Network Systems, Phoenix AZ, (6 pages), 1997.

\* cited by examiner

*Primary Examiner*—Phung M. Chung
(74) *Attorney, Agent, or Firm*—Philip R. Wadsworth; Kent D. Baker; Thomas R. Rouse (57) ABSTRACT

The present invention is a novel and improved technique for performing coding with particular application to turbo, or iterative, coding techniques. In accordance with one embodiment of the invention, interleaving is performed by generating the address of a memory using a PN state generator. Data is written into a memory in sequential order, and then read out using addresses specified by the PN state generator. To deinterleave, the interleaved data is written into a memory using addresses specified by the PN state generator, and then read out in sequential order. A set of PN state generators that provide excellent coding performance is provided.

15 Claims, 6 Drawing Sheets

CODING SYSTEM HAVING STATE MACHINE BASED INTERLEAVER

BACKGROUND OF THE INVENTION

I. Field of the Invention

The present invention relates to error correction coding. More particularly, the present invention relates to a novel and improved technique for performing iterative coding and decoding.

II. Description of the Related Art

"Turbo coding" represents an important advancement in the area of forward error correction (FEC). There are many variants of turbo coding, but most types of turbo coding use multiple encoding steps separated by interleaving steps combined with the use interative decoding. This combination provides previously unavailable performance with respect to noise tolerance in a communications system. That is, turbo coding allows communications at very low $E_b/N_0$ levels that were previously unattainable using the existing forward error correction techniques.

Many systems use forward error correction techniques, and therefore would benefit from the use of turbo coding. For example, turbo codes could improve the performance of wireless satellite links, where the limited downlink transmit power of the satellite necessitates receiver systems that can operate at low $E_B/N_0$ levels.

Digital wireless telecommunication systems, such as digital cellular and PCS telephone systems, also use forward error correction. For example, the IS-95 over-the-air interface standard, and its derivatives, such as IS-95B, define a digital wireless communications system that uses convolutional encoding to provide coding gain to increase the capacity of the system. A system and method for processing RF signals substantially in accordance with the use of the IS-95 standard is described in U.S. Pat. No. 5,103,459 entitled "System and Method for Generating Signal Waveforms in a CDMA Cellular Telephone System" assigned to the assignee of the present invention and incorporated herein by reference ('459 patent).

Because digital wireless communication system like IS-95 are primarily for mobile communications, it is important to have devices that minimize power usage and which are small and light. Typically, this requires development of a semiconductor integrated circuit ("chip") for performing most or all of the necessary processing. While convolutional encoding is relatively complex, the circuits necessary to perform convolutional encoding and decoding can be formed on a single chip along with any other necessary circuitry.

Turbo coding (in particular the decoding operation) is significantly more complex than convolutional encoding. Nonetheless, it would be highly desirable to include turbo coding in digital wireless telecommunication systems, including mobile digital communication systems. Thus, the present invention is directed to reducing the complexity associated with performing turbo coding, and therefore facilitating the use of turbo coding in systems where mobility is desirable, or where power consumption and circuit size are of concern.

SUMMARY OF THE INVENTION

The present invention is a novel and improved technique for performing coding with particular application to turbo, or iterative, coding techniques. In accordance with one embodiment of the invention, interleaving is performed by generating the address of a memory using a PN state generator. Data is written into a memory in sequential order, and then read out using addresses specified by the PN state generator. To deinterleave, the interleaved data is written into a memory using addresses specified by the PN state generator, and then read out in sequential order. A set of PN state generators that provide excellent coding performance is provided.

BRIEF DESCRIPTION OF THE DRAWINGS

The features, objects, and advantages of the present invention will become more apparent from the detailed description set forth below when taken in conjunction with the drawings in which like reference characters identify correspondingly throughout and wherein.

DETAILED DESCRIPTION OF THE PREFERRED EMBODIMENTS

The present invention is a novel and improved technique for performing turbo coding. The exemplary embodiment is described in the context of the digital cellular telephone system. While use within this context is advantageous, different embodiments of the invention may be incorporated in different environments or configurations. In general, the various systems described herein may be formed using software controlled processors, integrated circuits, or discrete logic, however, implementation in an integrated circuit is preferred. The data, instructions, commands, information, signals, symbols and chips that may be referenced throughout the application are advantageously represented by voltages, currents, electromagnetic waves, magnetic fields or particles, optical fields or particles, or a combination thereof. In addition, the blocks shown in each block diagram may represent either hardware or method steps.

Figure 1A:
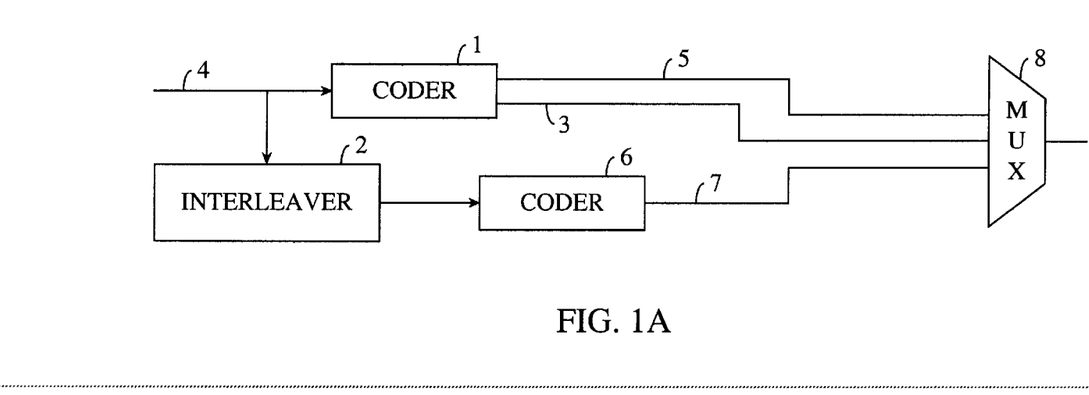
FIGS. 1A and 1B are block diagrams of turbo coders when configured in accordance with one embodiment of the invention.
Figure 1B:
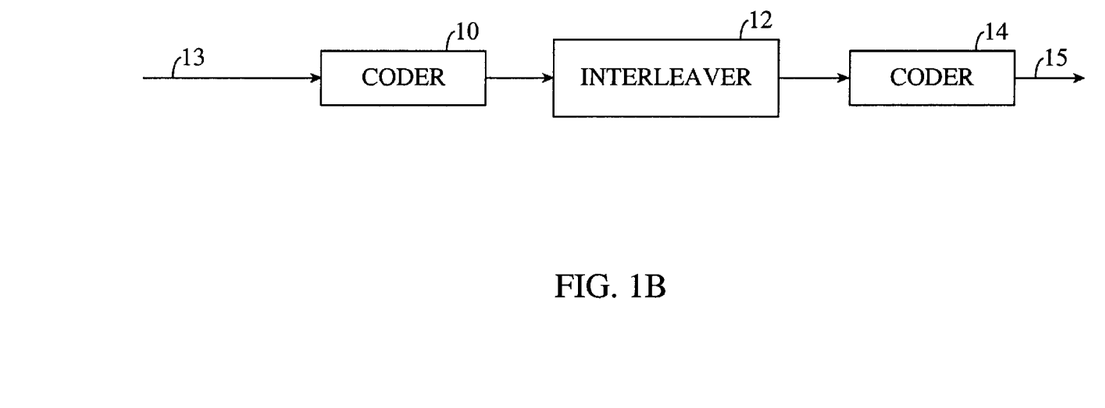

FIGS. 1A and 1B, provide highly simplified illustrations of two types of turbo coders. FIG. 1A depicts a parallel concatenated turbo encoder. Coder 1 and interleaver 2 receive the encoder input data 4 which is typically user information or control data. Coder 1 outputs systematic symbols 5 (typically a copy of the original input bits) and parity symbols 3. Coder 6 receives the interleaved output of interleaver 2 and outputs a second set of systematic and parity symbols 7. The systematic symbols from the second encoder are suppressed, and the remaining outputs of coder 1 and coder 6 are muxed into the output datastream.

Additional coder and interleaver pairs may be added to reduce the coding rate for increased forward error correction. Alternatively, some of the sytematic and/or parity symbols may be punctured, in order to increase the coding rate and provide better spectral efficiency.

Coders 1 and 6 are typically recursive systematic convolutional (RSC) encoders with a small constraint length of such as 4 (four). The lower constraint length reduces the complexity of the corresponding decoder. Typically, the two coders output two code symbols (one systematic and one parity symbol) for each bit received for a coding rate R=½. Since the systematic bits from coder 6 are suppressed, the total coding rate for the turbo coder of FIG. 1A is R=⅓. Additional interleaver and coder pairs may be added in parallel to reduce the coding rate, and therefore provide a higher level of error correction. Alternatively, some of the outputs of the above encoder may be punctured to increased and coding rate, and hence provide higher spectral efficiency.

FIG. 1B depicts a serial concatenated turbo coder. Input data 13 is coded by coder 10 and the code symbols are applied to interleaver 12. The resulting interleaved code symbols are supplied to coder 14, which performs additional encoding to generate code symbols 15. Typically, coder 10 (the outer coder) may be various types of encoders including block encoders or convolutional encoders, but coder 14 (the inner coder) must be a recursive coder and is typically a recursive systematic convolutional (RSC) encoder.

As recursive systematic convolutional (RSC) encoders, coders 10 and 14 generate symbols at a coding rate R<1. That is, for a given number of input bits N, M output symbols are generated where M>N. The total coding rate for the serial concatenated turbo coder of FIG. 1B is the coding rate of coder 10 multiplied by the coding rate of coder 14. Additional interleaver and coder pairs may also be added in series to reduce the coding rate and therefore provide additional error protection. Alternatively, the encoder outputs may be puncutured at any stage, in order to increase the coding rate, and hence provide higher spectral efficiency.

Figure 2:
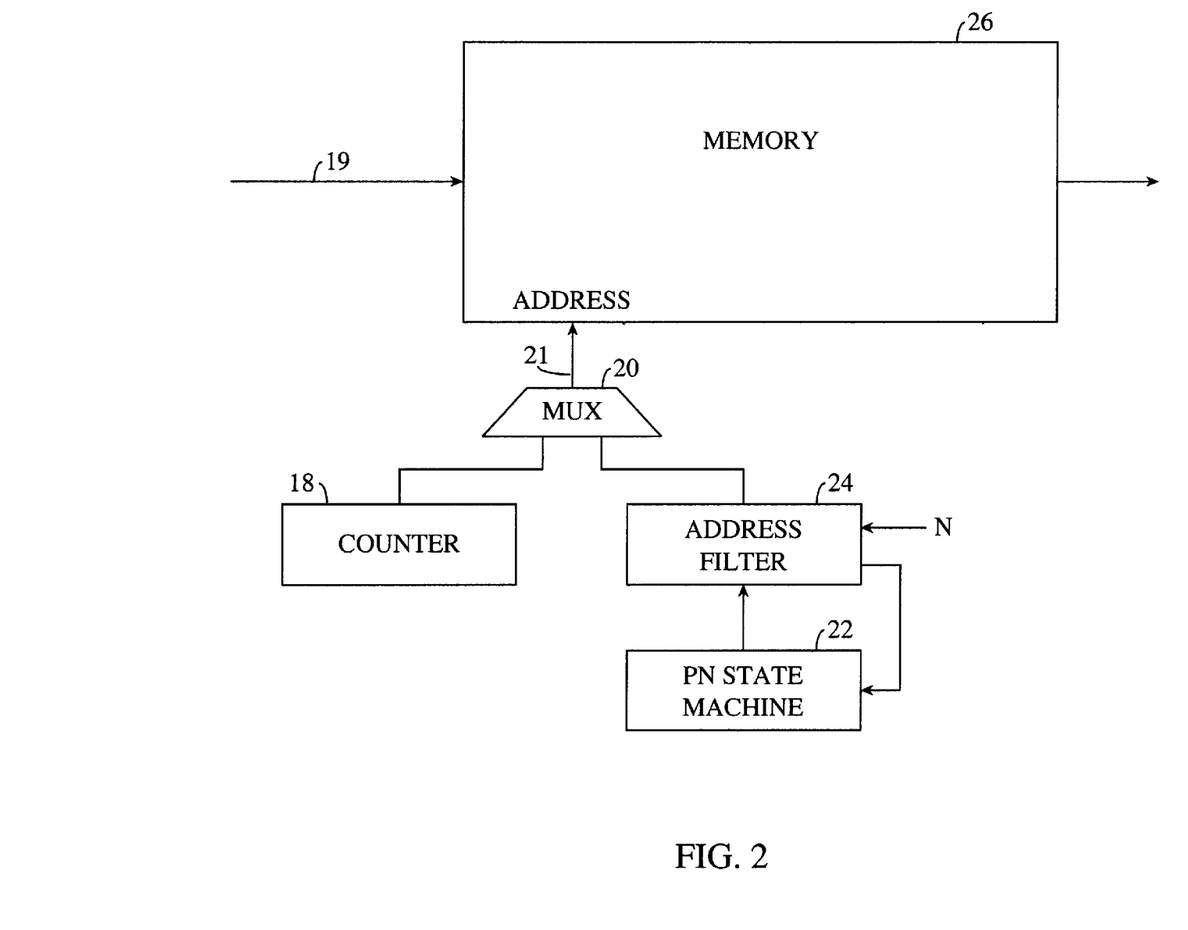
FIG. 2 is a block diagram of an interleaver when configured in accordance with one embodiment of the invention.

FIG. 2 is a block diagram of an interleaver configured in accordance with one embodiment of the invention. The interleaver may be used, for example, as interleavers 2 or 12 within the circuits of FIG. 1A or FIG. 1B. Within the interleaver, memory 26 receives encoder input data 19, as well as address data 21 from mux 20. Mux 20 supplies address data 21 from either counter 18 or PN state machine 22 and address filter 24. A control system (not shown for ease of drawing) controls mux 20, counter 18, PN state machine 22 and address filter 24. The control system is preferably comprised of a microprocessor or DSP running software instructions stored in memory.

During operation, encoder input data 19 is written into memory 26 with the address specified by the application of counter 18 to the address input using mux 20. Once a block of encoder input data 19 has been written in to memory 16, the data is then read out to coder 14 by applying PN state machine 22, after filtering by address filter 24, to the address input of memory 26 via mux 20. Thus, the data is read out in an alternative order to coder 14 with respect to the encoder data received by coder 10.

To perform deinterleaving, the PN state machine 22 is applied to the address input of the memory 26 as data is written in, and the counter 18 is applied to the address input of the memory 26 as data is read out. The benefits realized by the use of the interleaver of FIG. 2 for coding, as described throughout the application, are also realized when used for decoding.

Address filter 24 removes address from PN state machine 22 that are greater than the addressable memory space of memory 26. During operation address filter 24 receives addresses from PN state machine 22. The possible set of addresses for a PN generator of length L is equal to $2^L-1$, where L is the number of bits in the PN state. When the size of memory 26 is a number N that is less that $2^L-1$, but greater than $2^{L-1}-1$, address filter 24 determines when an address from PN state machine 22 is greater than the memory size N. If so, address filter 24 signals PN state machine 22 to switch to the next state, and performs the comparison again. So long as the address from PN state machine 22 exceeds N, address filter 24 will continue to advance the state of PN state machine 22 until an address that is less than N is generated. Thus, by adjusting N, and increasing or decreasing the number of bits generated by PN state machine 22, different sized memories can be accommodated by changing the value of N.

As noted above, address filter ensures that only addresses within the size of memory 16 are applied. As should be apparent, it is preferable to select PN state generators that do not produce large sequences of addresses that are greater than N. Also, it is preferable to configure PN state machine 22 with the ability to change PN state many times during the processing cycle of memory 26 so that a suitable address may be generated with sufficient speed. As should also be apparent, a state generator must be selected such that the PN state machine 22 does not enter the same state twice, before covering all the possible states. This condition will be satisfied if the PN generator produces a maximal length shift register sequence.

As is widely known, the use of simple "block" interleavers does not provide optimal performance for turbo coding. Without the use of block interleaving, however, or some other more regular interleaving scheme, it is typically necessary to use a "look-up-table" that specifies the sequence of addresses at which the data should be read out.

For the larger block sizes necessary to perform turbo coding optimally, such look-up-tables require significant amounts of additional on-chip memory—sometimes on the order of the interleaver memory itself. This memory can take up a significant amount of chip space, which in turn increases the cost and power consumption of the chip. Thus, an advantage of the invention is that more effective interleaving can be performed that provides high performance coding and decoding with a minimum of additional complexity. By using a PN state machine to generate the addresses, more complex interleaving can performed, and therefore higher performance coding and decoding obtained, with reduced circuit space and power consumption.

In an alternative embodiment of the invention, counter 18 may be replaced with another state machine. A second PN state machine could be used in place of counter 18, so long as the two PN state machines covered the necessary address space in different order. (Alternatively, a counter could simply be considered a PN state machine having a PN sequence equal to the binary counting sequence.)

In an alternative embodiment of the invention, the sequence of the PN states generated is adjusted to further increase performance with little additional complexity. For a set of PN states $S_1, S_1, S_3, \ldots S_N$ an integer k is found that is relatively prime to the period of the PN sequence $2^L-1$. The state sequence is then defined as $S_{(ki \bmod N)+1}$ to the index i, for each 0<=i<N. If $N=2^L-1$ this amounts to clocking the PN generator k times to obtain the next PN state.

In still another embodiment of the invention, two or more interleavers may be interlaced to generate a single interleaver of larger span. The two interleavers can both be polynomial based, and generally use different polynomials.

Combination of polynomial based and other types of interleavers is also contemplated.

In one example, two interleavers of equal length can be used in parallel to generate a single permutation in which the even and odd indices are permuted separately. This may be useful if the decoder needs to access two adjacent symbols of the interleaver input/output simultaneously without the use of a dual port memory.

In another example, two interleavers of different size may be interlaced to form a larger interleaver that is not an integral power of 2. For instance, interleavers of span 2047 and 1023 may be interlaced to construct a larger interleaver of span 3070. The two constituent interleavers are obtained from primitive polynomials of degree 11 and 10 respectively.

Figure 3A:
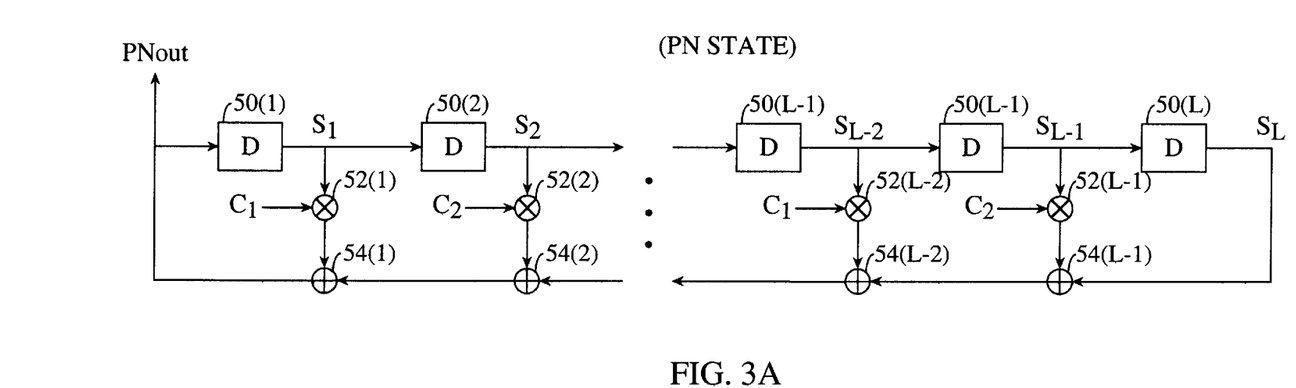
FIGS. 3A and 3B are diagrams of PN code generators when configured in accordance with one embodiment of the invention.
Figure 3B:
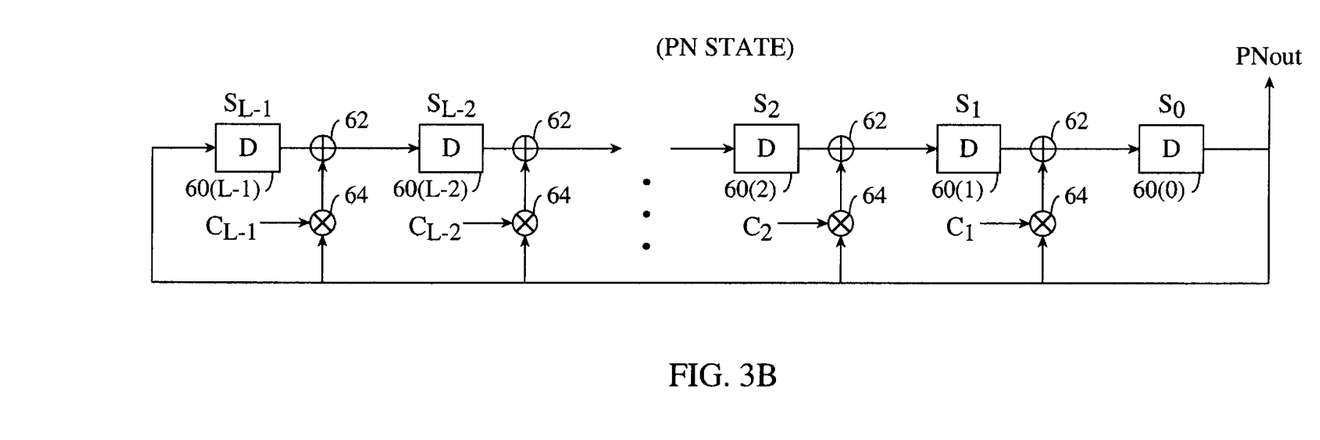

FIGS. 3A and 3B illustrate two PN sequence generators when configured in dance with one embodiment of the invention. Referring to FIG. 3A, a set of latches $50(1)$–$50(L)$ store state variables $S_1$–$S_L$. Polynomial coefficients $C_1$–$S_{L-1}$ are applied to AND-gates $52(1)$–$52(L-1)$, which also receive the state variables $S_1$–$S_{L-1}$. State variables $S_1$–$S_{L-1}$ are also applied to the input of the next latch.

XOR-gates $54(1)$–$(L-1)$ receive the outputs of AND-gates $52(1)$–$(L)$. XOR-gates $54(1)$–$54(L-2)$ also receive the outputs of adjacent XOR-gates $54(2)$–$54(L-1)$, XOR-gate $54(L)$ also receives the output of latch $50(L)$. The output of XOR-gate $54(1)$ is the output of the PN state machine, as well as the input to latch $50(1)$.

During operation, the polynomial coefficients determine the way the state varibles change as data is clocked through. The application of different polynomials changes the particular PN sequence generated, and the selection of certain polynomials generates a sequence of addresses which allow nearly optimal interleaving to be performed. By using a PN generated sequence, a circuit like that shown in FIG. 2A can use used. Such a circuit occupies significantly less circuit area a corresponding look-up-table, and therefore reduces the overall required area to implement the turbo coder.

FIG. 3B provides an alternative method for generating PN states. The XOR-gates $62(1)$–$62(L-2)$ are coupled between latches $62(0)$–$62(L)$, and the output of latch $60(0)$ is applied to AND-gates $64(1)$–$64(L-1)$ as well as to latch $60(L-1)$. AND-gates $64(1)$–$64(L-1)$ also receive polynomial coefficients $C(1)$–$C(L-1)$. The outputs AND-gates $64(1)$–$64(L-1)$ are applied to XOR-gates $62(1)$–$62(L-2)$. As with FIG. 3A, the application of different polynomials changes the particular PN sequence generated, and the selection of certain polynomials generates a sequence of addresses which allow nearly optimal interleaving to be performed.

In accordance with one embodiment of the invention, for certain values L, and therefore for different sized address spaces, the polynomials used in the PN state machine are as set forth in Table I:

TABLE I

| L | Max memory size | Polynomial |
|---|---|---|
| 9 | 511 | $1 + D^4 + D^9$ |
| 10 | 1023 | $1 + D^3 + D^{10}$ |
| 11 | 2047 | $1 + D^2 + D^{11}$ |
| 12 | 4095 | $1 + D + D^4 + D^6 + D^{12}$ |
| 13 | 8191 | $1 + D + D^3 + D^4 + D^{13}$ |
| 14 | 16383 | $1 + D + D^3 + D^5 + D^{14}$ |
| 15 | 32676 | $1 + D + D^{15}$ |

Typically, where an element of particular order is present in the polynomial the corresponding coefficient C is set to logic one; otherwise the coefficient is set to logic zero. Those skilled in the art will recognize various ways of implementing PN state machines that use the specified polynomial, or some derivative thereof. Also, the bit size of the address is preferably the smallest number L that gives a maximum address that is greater than or equal to the size N of the memory.

Figure 4A:
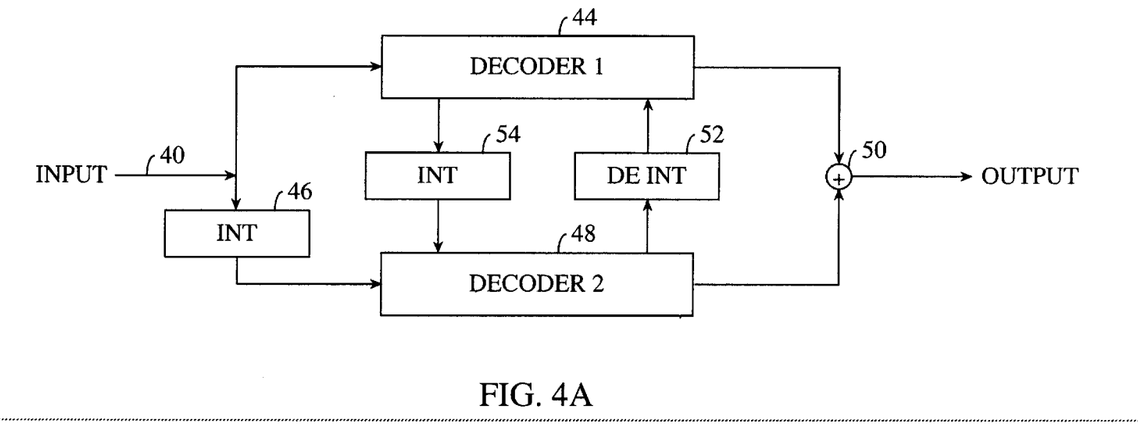
FIGS. 4A and 4B are block diagrams of decoders configured in accordance with one embodiment of the invention.

FIG. 4A is a block diagram of a decoder for parallel turbo coding when configured in accordance with one embodiment of the invention. Receive data is received on input 40 and applied to decoder 44 and interleaver 46. The output of deinterleaver 46 is applied to decoder 48 and the outputs of decoders 44 and 48 are applied to summer 50. The output of summer 50 forms the output of the decoder, but is also applied as a second input through a mux (not shown) for iterative decoding.

Additionally, decoder 48 and decoder 44 are coupled via interleaver 50 and deinterleaver 52.

During an exemplary operation, data received by decoder 44 and decoder 48 is repeatedly decoded and exchanged after by interleaved and deinterleaved by interleaver 54 and deinterleaver 52. Once a desired number of iterations is performed, or a desired error level achieved, the output is taken from the combiner 50.

Figure 4B:
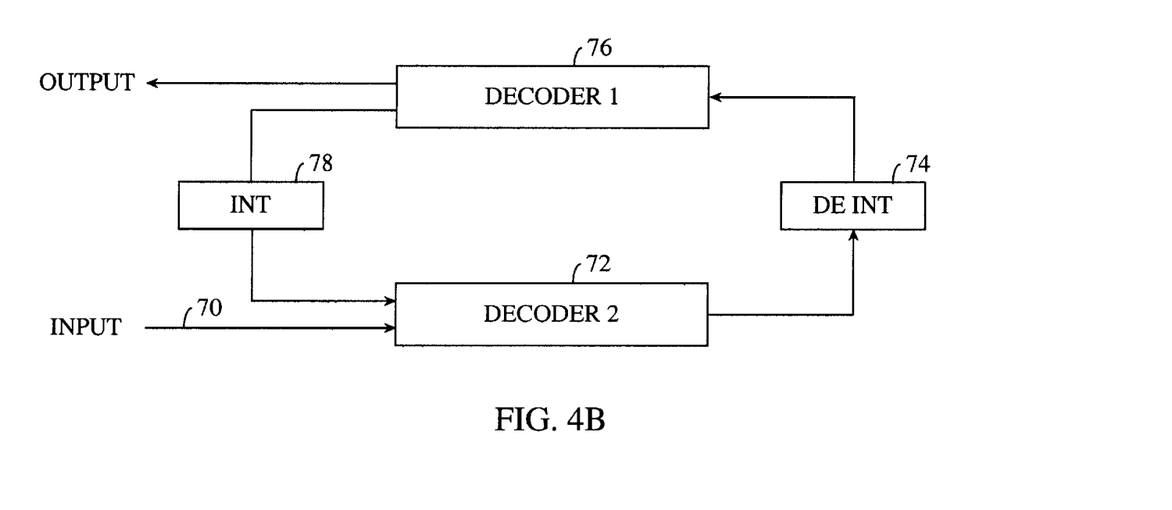

FIG. 4B is a block diagram of a decoder for serial turbo coding configured in accordance with one embodiment of the invention. Input data 70 is received by decoder 72, the output of which is applied to deinterleaver 74. The deinterleaved output of deinterleaver 74 is applied to decoder 76. The output of decoder 76 is applied to interleaver 78, the output of which is applied to decoder 72. The output of decoder 76 also forms the output of the serial turbo decoder.

During an exemplary operation, the received symbols are repeatedly decoded by decoders 72 and 76. Once a desired number of decoder iterations is performed, or a desired error level achieved, output is taken from decoder 76.

In one embodiment of the invention, deinterleavers of FIGS. 4A and 4B are configured in a similar manner to that shown in FIG. 2 except, as described above, the PN state machine is applied during writing and the counter is applied during reading. The interleavers are preferably configured as shown in FIG. 2.

Figure 5:
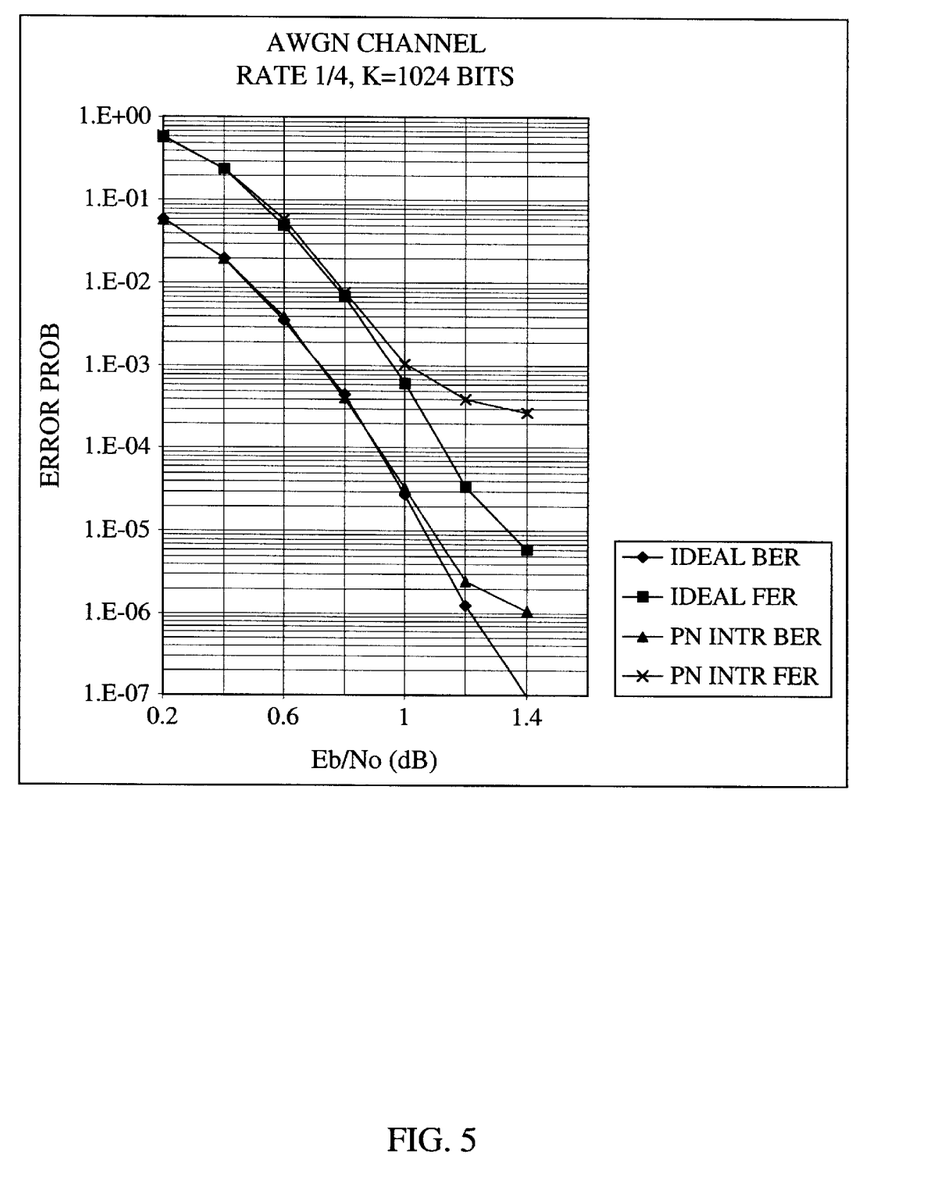
FIG. 5 is a graph illustrating the performance of one embodiment of the invention.

FIG. 5 is a graph illustrating the performance of a particular polynomial using a rate ¼ serial concatenated turbo code when compared to other interleaving schemes which require the use of a look-up-table. The value K is the size of the data frame being processed. The frame error rate (FER) and the bit error rate (BER) are shown for an ideal interleaver and the PN based interleaver. As shown, the performance of the PN based interleaving scheme is nearly identical to that of the look-up-table scheme at an error rate (error probability) of $1 \times 10^{-3}$. This error rate is the preferred level of operation for an IS-95 based CDMA wireless telecommunications system, as well as many other digital wireless systems. Thus, the savings in circuit space can be provided with little or no reduction in performance by use of the PN based interleaving scheme.

Figure 6:
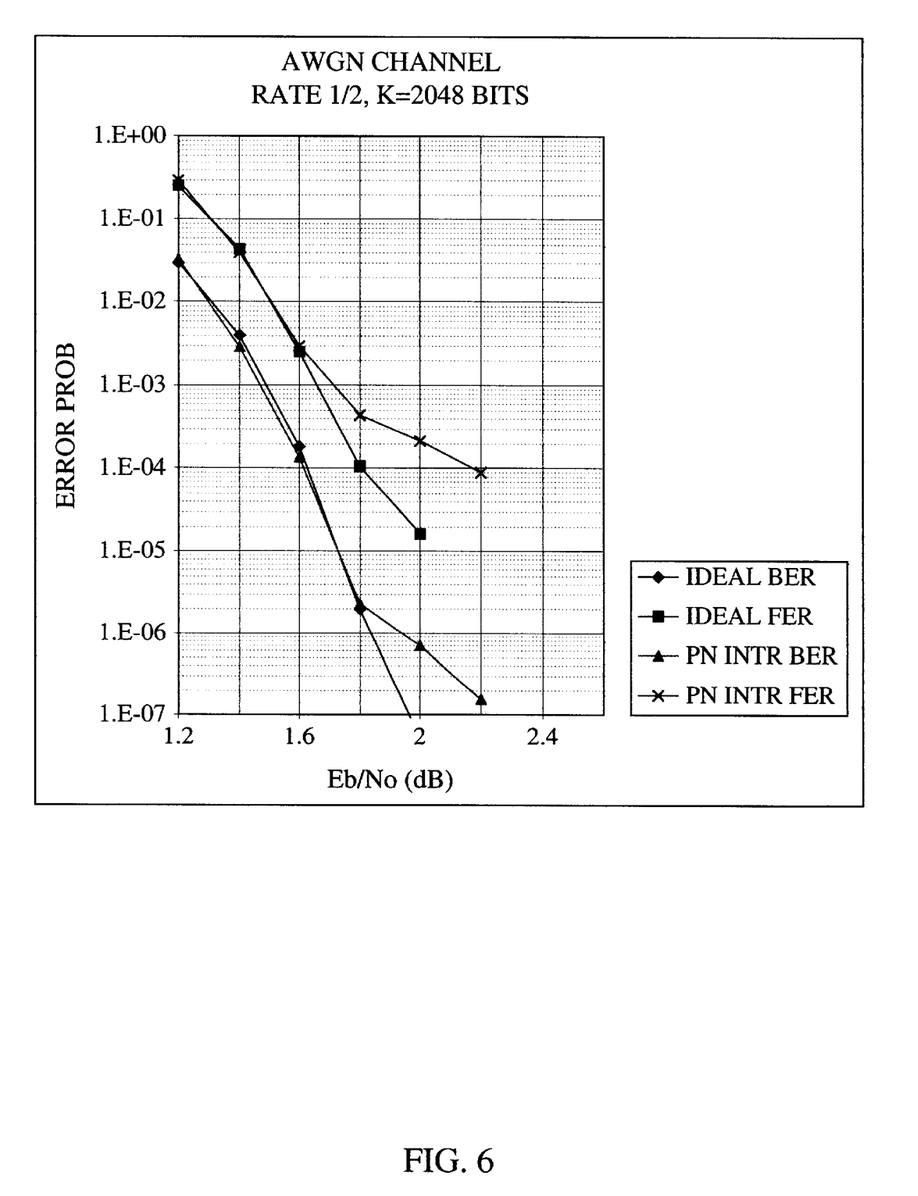
FIG. 6 is a graph illustrating the performance of another embodiment of the invention.

FIG. 6 is a graph illustrating a rate ½ serial concatenated turbo code when compared to other interleaving schemes which require the use of a look-up-table. Once again, the difference between the ideal and PN base interleaver is small at an error rate of $1\times10^{-3}$. Thus, the savings in circuit space can be provided with little or no reduction in performance by use of the PN based interleaving scheme.

Thus, a novel and improved technique for performing turbo coding has been described. The previous description of the preferred embodiments is provided to enable any person skilled in the art to make or use the present invention. The various modifications to these embodiments will be readily apparent to those skilled in the art, and the generic principles defined herein may be applied to other embodiments without the use of the inventive faculty. Thus, the present invention is not intended to be limited to the embodiments shown herein but is to be accorded the widest scope consistent with the principles and novel features disclosed herein.

What is claimed is:

1. A method for decoding encoded data comprising the steps of:
   (a) writing the encoded data into a memory using a first address generation unit; and
   (b) reading the encoded data from said memory using a second address generation unit that generates a set of addresses by incrementing a PN state machine.

2. The method as set forth in claim 1 further comprising the step of:
   removing an address from said set of addresses, if said address is greater than a number N, where N is an amount of encoded data to be interleaved.

3. The method as set forth in claim 2, wherein said PN state machine has a state of L bits, where L is the smallest number to satisfy the equation $N<=2^L-1$.

4. The method of claim 1 wherein said second address unit comprises a state machine using the following polynomials:
   $1+D^4+D^9$ when memory size is >256 and <=511;
   $1+D^3+D^{10}$ when memory size is >511 and <=1023;
   $1+D^2+D^{11}$ when memory size is >1024 and <=2047;
   $1+D+D^4+D^6+D^{12}$ when memory size is >2047 and <=4095;
   $1+D+D^3+D^4+D^{13}$ when memory size is >4095 and <=8191;
   $1+D+D^3+D^5+D^{14}$ when memory size is >8191 and <=16383;
   $1+D+D^{15}$ when memory size is >163831 and <=32767.

5. A system for coding data comprising:
   memory of size N, having an address input and a data input;
   counter means for controlling said address input when data is written into said memory; and
   PN state machine for controlling said address input when data is read out of said memory.

6. The system as set forth in claim 5 further comprising:
   address filter for removing values greater than N generated by said PN state machine.

7. The system as set forth in claim 6 further comprising:
   a first coder, coupled to said memory, for generating first code symbols in response is input data.

8. The system as set forth in claim 6 further comprising a second coder for coding symbols received from said memory.

9. A method for decoding data comprising the steps of:
   writing said data using a first set of addresses defined by a PN state machine;
   reading said data using a second set of addresses defined by a counter.

10. The method as set forth in claim 9 further comprising the steps of:
    removing an address from said set first of addresses, if said address is greater than a number N, where N is an amount of encoded data to be interleaved.

11. The method of claim 9 wherein said PN state machine uses the following polynomials:
    $1+D^4+D^9$ when memory size is >256 and <=511;
    $1+D^3+D^{10}$ when memory size is >511 and <=1023;
    $1+D^2+D^{11}$ when memory size is >1024 and <=2047;
    $1+D+D^4+D^6+D^{12}$ when memory size is >2047 and <=4095;
    $1+D+D^3+D^4+D^{13}$ when memory size is >4095 and <=8191;
    $1+D+D^3+D^5+D^{14}$ when memory size is >8191 and <=16383;
    $1+D+D^{15}$ when memory size is >163831 and <=32767.

12. A decoder comprising:
    memory of size N, having an address input and a data input;
    PN state machine for controlling said address input when data is written into said memory; and
    counter means for controlling said address input when data is read out of said memory.

13. The decoder as set forth in claim 12 further comprising:
    address filter for removing values greater than N generated by said PN state machine.

14. The decoder as set forth in claim 13 further comprising:
    a first coder, coupled to said memory, for generating first code symbols in response is input data.

15. The system as set forth in claim 14 further comprising a second coder for coding symbols received from said memory.

* * * * *